(12) United States Patent
Breuer et al.

(10) Patent No.: US 7,663,856 B2
(45) Date of Patent: Feb. 16, 2010

(54) SPARK GAP COMPRISING AN OPTICALLY TRIGGERED POWER SEMICONDUCTOR COMPONENT

(75) Inventors: Wilfried Breuer, Erlangen (DE); Peter Menke, Oberfüllbach (DE)

(73) Assignee: Siemens Aktiengesellschaft, Munich (DE)

( * ) Notice: Subject to any disclaimer, the term of this patent is extended or adjusted under 35 U.S.C. 154(b) by 218 days.

(21) Appl. No.: 10/597,097

(22) PCT Filed: Jan. 10, 2005

(86) PCT No.: PCT/DE2005/000036

§ 371 (c)(1),
(2), (4) Date: May 29, 2007

(87) PCT Pub. No.: WO2005/069459

PCT Pub. Date: Jul. 28, 2005

(65) Prior Publication Data

US 2007/0285858 A1  Dec. 13, 2007

(30) Foreign Application Priority Data

Jan. 13, 2004  (DE) .................. 10 2004 002 581

(51) Int. Cl.
H02H 1/00 (2006.01)
(52) U.S. Cl. .................... 361/120; 361/111; 361/15
(58) Field of Classification Search .............. 361/56, 361/91.1, 111, 117–118
See application file for complete search history.

(56) References Cited

U.S. PATENT DOCUMENTS 4,121,270 A * 10/1978 Peterson ................ 361/54
4,536,816 A * 8/1985 Matsumura et al. ......... 361/91.8

(Continued)

FOREIGN PATENT DOCUMENTS

DE 19718660 A1 11/1998

(Continued)

OTHER PUBLICATIONS

EUPEC (European Power-Semiconductor and Electronics Company) "Light Triggered Thyristors, Optical Fibres and Laser Diodes" Marketing News (4 pages), Jan. 24, 2000.

(Continued)

Primary Examiner—Stephen W Jackson
Assistant Examiner—Terrence R Willoughby
(74) Attorney, Agent, or Firm—King & Spalding L.L.P.

(57) ABSTRACT

A surge protector (1) has a spark gap (2) that is provided with two opposite electrodes (3), a circuit (5) for triggering the spark gap (2), and a light source connected to a protective device (13) on ground potential in order to generate a triggering light which can be delivered with the aid of at least one optical waveguide (15) of a receiver unit of the triggering circuit (5), the spark gap (2) and the triggering circuit (5) being on a high voltage potential. In order to make the surge protector (1) reliable and inexpensive, the receiver unit is provided with at least one power semiconductor component (16) that can be moved, with the aid of the triggering light, from a locked position in which current conduction via the power semiconductor component (16) is interrupted into an open position in which current conduction via the power semiconductor component (16) is made possible.

15 Claims, 3 Drawing Sheets

U.S. PATENT DOCUMENTS

| | | | |
|---|---|---|---|
| 4,703,385 A | | 10/1987 | Stenström .................... 361/16 |
| 4,860,156 A | * | 8/1989 | Stenstrom et al. ........... 361/128 |
| 5,153,460 A | | 10/1992 | Bovino et al. ............... 307/108 |
| 5,233,498 A | | 8/1993 | Kansala ...................... 361/130 |

FOREIGN PATENT DOCUMENTS

| | | | |
|---|---|---|---|
| DE | 102004002581 A1 | | 8/2005 |
| EP | 0979548 B1 | | 3/2001 |
| GB | 2146466 A | | 4/1985 |
| JP | 04179086 A | | 6/1992 |
| JP | 06165369 A | | 6/1994 |
| JP | 07-245387 | * | 9/1995 |
| JP | 09205728 A | | 8/1997 |

OTHER PUBLICATIONS

International Search Report and Written Opinion for International Application No. PCT/DE2005/000036 (7 pages), May 17, 2005.

* cited by examiner

US 7,663,856 B2

SPARK GAP COMPRISING AN OPTICALLY TRIGGERED POWER SEMICONDUCTOR COMPONENT

CROSS-REFERENCE TO RELATED APPLICATIONS

This application is a U.S. national stage application of International Application No. PCT/DE2005/000036 filed Jan. 10, 2005, which designates the United States of America, and claims priority to German application number DE 10 2004 002 581.9 filed Jan. 13, 2004, the contents of which are hereby incorporated by reference in their entirety.

TECHNICAL FIELD

The invention relates to a surge protector comprising a spark gap, which has mutually opposite electrodes, a trigger circuit for triggering the spark gap and a light source, which is connected to a protective device, at ground potential for generating a trigger light, which can be supplied to a reception unit of the trigger circuit by means of at least one optical waveguide, the spark gap and the trigger circuit being at a high-voltage potential.

BACKGROUND

Such a surge protector is already known from the common prior art. FIG. 1 shows such a surge protector, which has a main spark gap 2 comprising main electrodes 3. The main electrodes are connected in parallel with series capacitors, which are connected to a three-phase AC voltage system at a high-voltage potential. Owing to the bridging by means of the spark gap, the capacitor is protected against excessively high voltages. In this case, the series capacitors or other electronic components to be protected are arranged on a platform 4, which is set up in an insulated manner and is supported by means of supports in the form of columns (not illustrated in the figures) in an environment at ground potential. For example, the main electrode 3 illustrated at the bottom in FIG. 1 is therefore at a high-voltage potential, which corresponds to that of the platform 4, while the main electrode 3 illustrated at the top in FIG. 1 is at the high-voltage potential of the three-phase system. There is a voltage drop of between approximately 60 kV and 160 kV between the main electrodes, with the result that the components arranged on the platform 4 are designed for this voltage drop.

In order to actively trigger the spark gap 2, a trigger circuit 5 and a trigger electrode 6 are provided, the trigger circuit 5 having a capacitive voltage divider comprising a first capacitor 7 and a second capacitor 8. The second capacitor 8 can be bridged by a parallel branch, in which a tripping spark gap 9 and, connected in series with this tripping spark gap, a nonreactive resistor 10 are arranged. The tripping spark gap 9 can be moved over to its on position by means of control electronics 11, in which position a current flow via the parallel branch and thus bridging of the second capacitor 8 is made possible. Owing to the bridging, the trigger electrode 6 is connected to the potential of the lower main electrode 3, which is arranged physically closer to the upper main electrode 3 than the lower main electrode 3, however. A spark discharge results, which jumps over to the lower main electrode 3. The control electronics 11 can be supplied with the energy required for tripping the tripping spark gap 9 via an energy supply 12.

Triggering of the tripping spark gap 9 takes place actively. In this case, a protective device 13 monitors measured electrical variables of the three-phase system such as the alternating current of each phase of the three-phase system and/or the voltage drop across the electronic components on the platform 4. If tripping conditions are present, such as, for example, a threshold voltage at the component being exceeded, the protective device 13 generates a tripping signal, which is transmitted to a semiconductor laser 14, which thereupon generates an optical tripping signal, which is fed, via an optical waveguide 15, to the control electronics 11, as the reception unit. On reception of an optical tripping signal or in other words a trigger light, the control electronics cause the spark gap 2 to be tripped electrically.

The protective device 13 and the semiconductor laser 14 are at a ground potential, which makes it easier to gain access and simplifies maintenance, if required. The optical waveguide 15 makes it possible for the trigger light to be passed on safely, at the same time the insulation between the platform 4, which is at a high-voltage potential, and the components 13 and 14, which are at ground potential, of the surge protector 1 being maintained.

In particular owing to the electronics required with the energy supply on the platform 4, the previously known surge protector is cost-intensive and complex in terms of its maintenance.

SUMMARY

One object of the invention is to provide a surge protector of the type mentioned initially which is reliable and cost-effective.

This object is achieved by the invention by the reception unit having at least one power semiconductor component, which can be moved over, by means of the trigger light, from an off position, in which a current flow via the power semiconductor component is interrupted, to an on position, in which a current flow via the power semiconductor component is made possible.

The invention simplifies driving of the surge protector. Instead of supplying the trigger light to an optoelectric converter, for example a diode, which generates an electrical tripping signal as a function of the received light intensity, the trigger light is supplied directly to a power semiconductor component which can be triggered optically, which makes a current flow possible owing to the triggering. In this manner, a current flow is made possible for a short period of time, for example, in a current branch, it being possible for said current flow to be established using any desired circuitry for triggering the spark gap. In contrast to the prior art, the power semiconductor components do not require an energy supply, which is susceptible to maintenance, at a high-voltage potential, with the result that the surge protector according to the invention stands out as regards its costs and reliability.

The semiconductor components are advantageously in the form of thyristors which are connected in opposition and can be triggered optically. Thyristors can actively only be moved over from their off position to the on position. The reverse operation takes place passively. In the event of a zero crossing of an alternating current flowing via the thyristor, the alternating current falls below the holding current of the power switch component, with the result that said power switch component is again moved over to its off position. In order to increase the dielectric strength, a plurality of thyristors can also be connected in series.

In accordance with one expedient further development in this regard, further optical waveguides are provided, with the result that each thyristor can be supplied with trigger light via a dedicated optical waveguide. In order to feed the trigger light into the further optical waveguide, a corresponding number of further light sources is provided, for example, which are each connected to an associated optical waveguide. As a deviation from this, it is possible to use one or more optical couplers in order to distribute the trigger light from a single light source between the available optical waveguides, as required. Optical couplers are known from the prior art, and therefore no further details need to be given at this juncture explaining their operation.

The trigger circuit advantageously has a capacitive voltage divider, which has a capacitor which can be bridged by means of the power semiconductor component. Owing to the bridging of one of the capacitors of the voltage divider, it is possible, for example, for a current surge to be generated, with the result that a voltage pulse can be generated in a trigger coil, via a coil, which brings about tripping of the spark gap.

As a deviation from this, the trigger circuit is connected to a trigger electrode, whose distance from a first electrode of the spark gap is less than the distance between a first electrode and the second electrode opposite it, it being possible for the electrical potential of the second electrode to be applied to the trigger electrode by means of the trigger circuit.

In one expedient variant, the spark gap has at least two pairs of mutually opposite electrodes, which are arranged in a series circuit with respect to one another, the capacitor which can be bridged being connected in parallel with a pair of mutually opposite electrodes. In other words, the spark gap comprises two or more spark gap sections. Once the capacitor has been bridged, the voltage drop previously present across all of the spark gap sections is now present across the spark gap sections which are not bridged. Owing to the thereby increased voltage drop across the unbridged spark gap sections, a spark discharge occurs across these spark gap sections. Once the semiconductor component has been moved over to its off position, there is also an increased voltage drop across the spark gap sections which are connected in parallel with the capacitor, said increased voltage bringing about a spark discharge in this case, too.

In the context of the invention, it is furthermore possible for an auxiliary spark gap to be triggered by the power semiconductor component, said auxiliary spark gap being part of the trigger circuit, the spark gap which is connected in parallel with the component to be protected being triggered by the auxiliary spark gap being triggered. If required, the trigger circuit comprises a plurality of auxiliary spark gaps which are connected in series with one another in order to increase the dielectric strength of the trigger circuit. In this case, it may be sufficient, as has previously been described, to only bridge one auxiliary spark gap by the power semiconductor components.

In accordance with one preferred development of the invention, the spark gap and the trigger circuit are arranged on a platform which is supported in an insulated manner by means of supports and is designed to bear components which are provided for the purpose of improving the power transmission in an AC voltage-carrying energy distribution system. Such components are, for example, capacitors or coils, which are used to compensate for wattless power and are either connected in series or in parallel in the three-phase system. In this manner, excessively large distances between terminals of the components at a high-voltage potential and terminals at ground potential can be avoided. Owing to the parallel circuit with the surge protector, the components can be protected against surges.

According to the invention, the light source is, for example, an expedient laser. The laser may be arranged in the direct vicinity of the control unit, the laser pulses for tripping the surge protector being transmitted via the nonconductive optical waveguide to the platform and received there by the power semiconductor component, as a result of which triggering of the spark gap and therefore protection of the desired component on the platform is provided. A suitable laser is, for example, a semiconductor laser, whose laser pulse can be coupled into the optical waveguide(s) via a coupling element. As a deviation from this, however, it is also possible for a fiber laser to be integrated in the optical waveguide(s), said fiber laser being pumped via a semiconductor laser. In this case, the semiconductor laser is connected to a protective device, which in turn is supplied with measured electrical variables by measuring transducers, which measure, for example, the voltage drop across a component, the surge protector being provided for the purpose of protecting this component. The component is, for example, a capacitor which is arranged on a platform and is connected in series in one phase of a three-phase system. The measured values produced by the measuring transducer are sampled and digitized, the protective device comparing the digital voltage values derived from the measured values with tripping conditions via logic implemented in it and generating a tripping signal in the event of a tripping condition being present, which tripping signal causes the semiconductor laser to output a laser pulse.

BRIEF DESCRIPTION OF THE DRAWINGS

Further expedient refinements and advantages of the invention are the subject matter of the description below relating to exemplary embodiments of the invention with reference to the figures in the drawing, in which.

DETAILED DESCRIPTION

Figure 1:
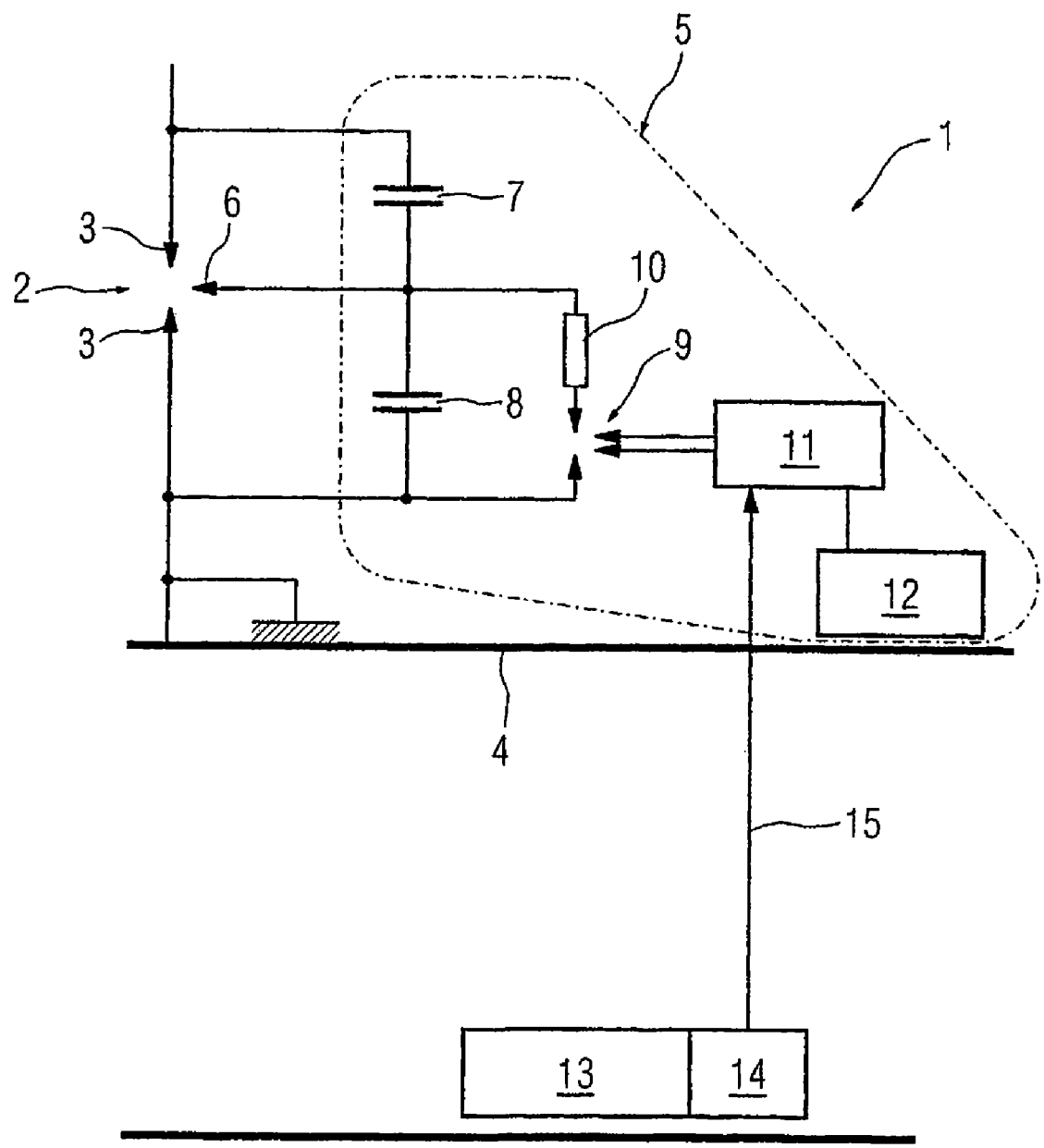
FIG. 1 shows a previously known surge protector in accordance with the prior art.

FIG. 1 shows a surge protector in accordance with the prior art, which has already been described above.

Figure 2:
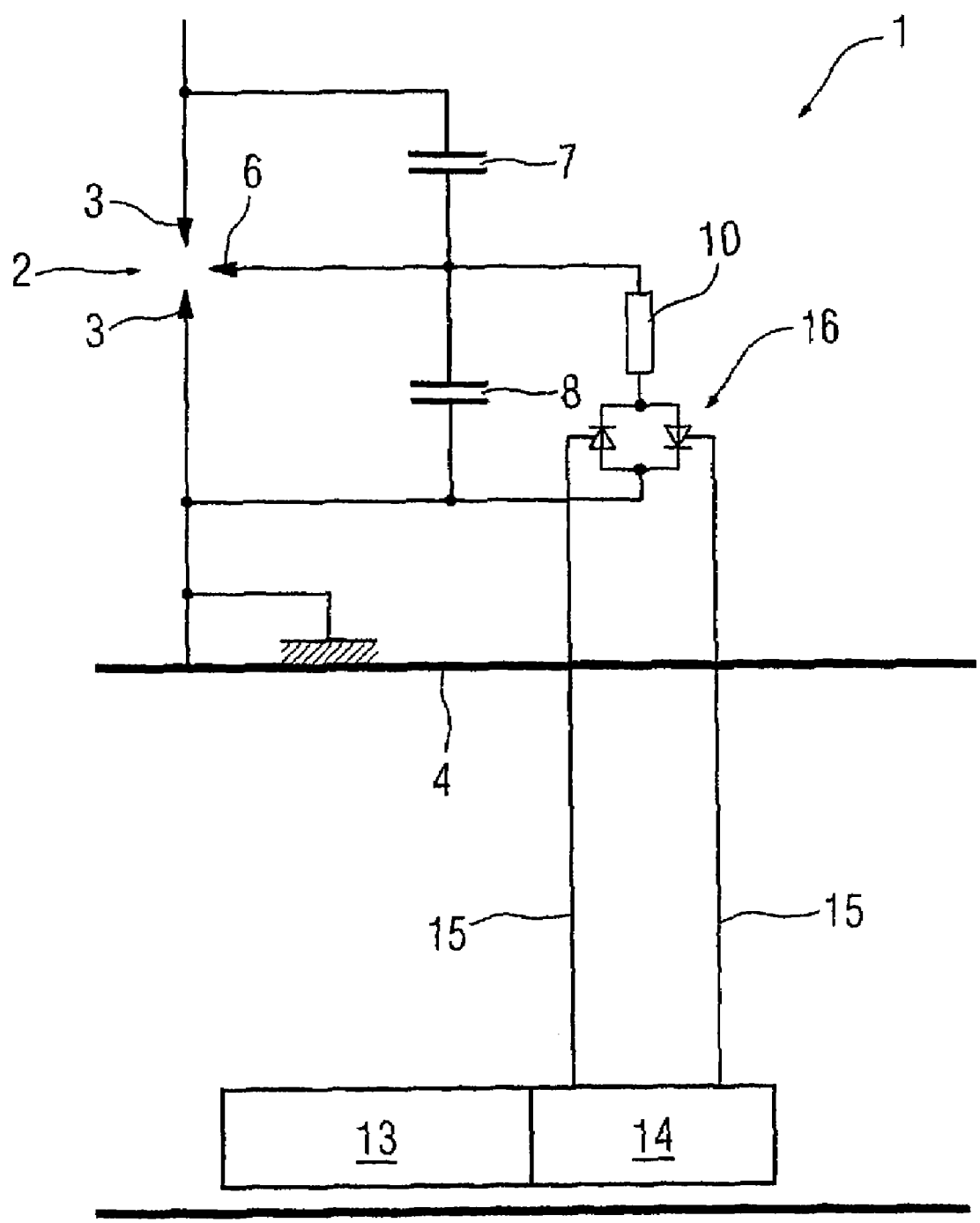
FIG. 2 shows an exemplary embodiment of the surge protector according to the invention, in a schematic illustration.

FIG. 2 shows an exemplary embodiment of the surge protector 1 according to the invention, which is provided for the purpose of protecting a component (not illustrated in the figure), such as a high-voltage capacitor, the high-voltage capacitor being connected in series in a high-voltage three-phase system. As has already been described in connection with FIG. 1, the electrical components arranged on the platform 4 are at a high-voltage potential, whose voltage drop with respect to the respective phases of the three-phase system is in the medium-voltage range. In this manner, excessively large distances can be avoided in order to bring about the required dielectric strengths. The surge protector is arranged in a parallel circuit with the component to be protected.

As the surge protector shown in FIG. 1, the surge protector 1 shown in FIG. 2 is triggered actively, voltage values which are present across the component to be protected being fed to the protective device 13, which checks them for the presence of a tripping condition. If the voltage drop across the component to be protected exceeds, for example, a maximum threshold value, the protective device generates an electrical tripping pulse for the purpose of tripping the laser 14, which thereupon generates a light pulse as the trigger light, which can be coupled into the optical waveguide 15. The electrically nonconductive waveguide 15 is connected at its end facing away from the laser 14 to a thyristor 16, which, after reception of a trigger pulse via the optical waveguide 15, is moved over from an off position, in which a current flow through the thyristor 16 is interrupted, to its on position, in which a current flow in one direction is made possible.

The surge protector 1 shown is envisaged for alternating currents, with the result that two thyristors 16, which are connected in opposition, are connected in parallel with one another in order to allow currents having different polarities to pass through. The second thyristor 16 is also coupled to an optical waveguide 15, which leads to the laser 14. In this case, the laser 14 is equipped with means which couple the trigger light into one or the other optical waveguide 15, depending on the control signal on the part of the protective device 13.

If one of the thyristors 16 is in its on position, the trigger electrode 6, whose distance from the upper (in FIG. 2) main electrode 3 is less than the distance between the lower main electrode 3 and the upper main electrode, is connected to the potential of the lower main electrode. Owing to the reduction in distance, there is a breakdown between the upper main electrode 3 and the trigger electrode 6, the trigger spark jumping from the upper main electrode to the lower main electrode as soon as both thyristors 16 are in their off position again. This occurs at a zero crossing for the alternating current.

Figure 3:
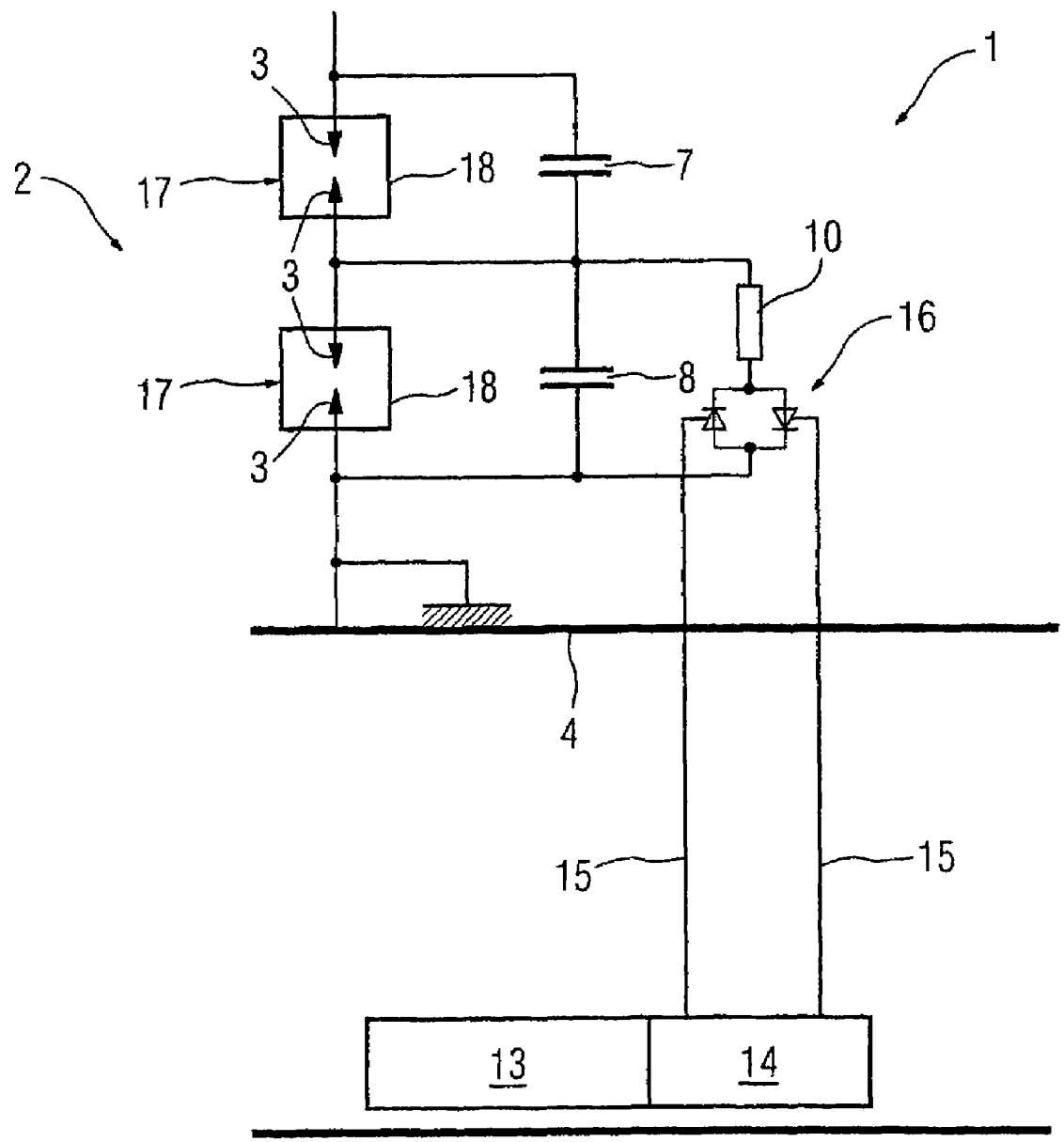
FIG. 3 shows a further embodiment of the surge protector according to the invention, in a schematic illustration.

FIG. 3 shows a further exemplary embodiment of the surge protector 1 according to the invention, in a schematic illustration. The spark gap 2 in this case comprises two spark gap sections 17, which each have a pair of mutually opposite electrodes 3. The spark gap sections 17 are arranged in a series circuit and are each connected in parallel with a capacitor 7, 8. When the capacitor 8 is bridged by the thyristors 16 being triggered, the total voltage is present across the upper (in FIG. 3) spark gap section 17, the electrodes of said spark gap section 17 having a distance between them which is insufficient for holding the total voltage. Trigger sparking results. Once the thyristors 16 have been moved over to their off position, the total voltage is present across the spark gap section 17 illustrated at the bottom in FIG. 3, said spark gap section 17 thereupon likewise triggering. Each of the spark gap sections has a dedicated gas-tight housing 18.

Owing to the series circuit comprising spark gap sections 17, the spark gap 2 can overall be designed for relatively high voltages, without having to take on board disadvantages as regards its control possibilities. The spark gap shown in FIG. 3 is therefore designed for voltages in the range between 160 kV and 300 kV. The surge protector shown in FIG. 2, on the other hand, can advantageously be used for voltages in the range between 60 kV and 160 kV.

What is claimed is:

1. A surge protector comprising a spark gap, which has mutually opposite electrodes, a trigger circuit for triggering the spark gap and a light source, which is connected to a protective device, at ground potential for generating a trigger light, which can be supplied to a reception unit of the trigger circuit by means of at least one optical waveguide, the spark gap and the trigger circuit being at a high-voltage potential, wherein
the reception unit has at least one power semiconductor component, which can be converted, by means of the trigger light, from an off position, in which a current flow via the power semiconductor component is interrupted, to an on position, in which a current flow between the mutually opposite electrodes via the power semiconductor component is made possible.

2. A surge protector according to claim 1, wherein
the power semiconductor component is in the form of at least two thyristors which are connected in opposition and can be triggered optically.

3. A surge protector according to claim 1, wherein
the trigger circuit has a capacitive voltage divider, which has a capacitor which can be bridged by means of the power semiconductor component.

4. A surge protector according to claim 1, wherein
the trigger circuit is connected to a trigger electrode, whose distance from a first electrode of the spark gap is less than the distance between the first electrode and a second electrode opposite it, it being possible for the electrical potential of the second electrode to be applied to the trigger electrode by means of the trigger circuit.

5. A surge protector according to claim 3, wherein
the spark gap has at least two pairs of mutually opposite electrodes, which are arranged in a series circuit with respect to one another, the capacitor which can be bridged being connected in parallel with a pair of mutually opposite electrodes.

6. A surge protector comprising:
a spark gap comprising mutually opposite electrodes,
a trigger circuit for triggering the spark gap, and
a light source coupled with a protective device and being at ground potential for generating a trigger light, wherein the trigger light can be fed to a reception unit of the trigger circuit by at least one optical waveguide, wherein the spark gap and the trigger circuit are at a high-voltage potential, wherein the reception unit has at least one power semiconductor component which can be switched by the trigger light from an off position, in which a current flow via the power semiconductor component is interrupted, to an on position, in which a current flow between the mutually opposite electrodes via the power semiconductor component is made possible.

7. A surge protector according to claim 6,
wherein the power semiconductor component is in the form of thyristors which are connected in opposition and can be triggered optically.

8. A surge protector according to claim 6,
wherein the trigger circuit has a capacitive voltage divider, which has a capacitor which can be bridged by means of the power semiconductor component.

9. A surge protector according to claim 6,
wherein the trigger circuit is connected to a trigger electrode, whose distance from a first electrode of the spark gap is less than the distance between the first electrode and a second electrode opposite it, it being possible for the electrical potential of the second electrode to be applied to the trigger electrode by means of the trigger circuit.

10. A surge protector according to claim 8,
wherein the spark gap has at least two pairs of mutually opposite electrodes, which are arranged in a series circuit with respect to one another, the capacitor which can be bridged being connected in parallel with a pair of mutually opposite electrodes.

11. A surge protector comprising:
a spark gap comprising mutually opposite electrodes,
a trigger circuit for triggering the spark gap, and
a light source coupled with a protective device and being at ground potential for generating a trigger light, wherein the trigger light can be fed to a reception unit of the trigger circuit by at least one optical waveguide, wherein the spark gap and the trigger circuit are at a high-voltage potential, wherein the reception unit has at least one power semiconductor component which can be switched by the trigger light from an off position, in which a current flow via the power semiconductor component is interrupted, to an on position, in which a current flow between the mutually opposite electrodes via the power semiconductor component is made possible, and wherein the power semiconductor components are in the form of thyristors which are connected in opposition and can be triggered optically.

12. A surge protector according to claim 11, wherein the trigger circuit has a capacitive voltage divider, which has a capacitor which can be bridged by means of the power semiconductor component.

13. A surge protector according to claim 11, wherein the trigger circuit is connected to a trigger electrode, whose distance from a first electrode of the spark gap is less than the distance between the first electrode and a second electrode opposite it, it being possible for the electrical potential of the second electrode to be applied to the trigger electrode by means of the trigger circuit.

14. A surge protector according to claim 12, wherein the spark gap has at least two pairs of mutually opposite electrodes, which are arranged in a series circuit with respect to one another, the capacitor which can be bridged being connected in parallel with a pair of mutually opposite electrodes.

15. A surge protector comprising
a spark gap, which has mutually opposite electrodes,
a trigger circuit for triggering the spark gap; and
a light source which is connected to a protective device, at ground potential for generating a trigger light, which can be supplied to a reception unit of the trigger circuit by means of at least one optical waveguide, the spark gap and the trigger circuit being at a high-voltage potential, wherein the reception unit comprises a first light triggered thyristor coupled inversely with a second light triggered thyristor, wherein the first and second thyristor are switched by means of the trigger light from an off position, in which a current flow via the first and second thyristor is interrupted, to an on position, in which a current flow between the mutually opposite electrodes via the first and second thyristor is made possible.

* * * * *